US008903110B2

(12) United States Patent
Miura

(10) Patent No.: US 8,903,110 B2
(45) Date of Patent: Dec. 2, 2014

(54) DIGITAL AUDIO MIXER AND METHOD THEREOF

(75) Inventor: Daisuke Miura, Hamamatsu (JP)

(73) Assignee: Yamaha Corporation (JP)

( * ) Notice: Subject to any disclaimer, the term of this patent is extended or adjusted under 35 U.S.C. 154(b) by 226 days.

(21) Appl. No.: 13/303,403

(22) Filed: Nov. 23, 2011

(65) Prior Publication Data

US 2012/0275626 A1 Nov. 1, 2012

(30) Foreign Application Priority Data

Nov. 24, 2010 (JP) ................................. 2010-261819

(51) Int. Cl.
*H04B 1/00* (2006.01)
*H04H 60/04* (2008.01)
*H03G 3/00* (2006.01)

(52) U.S. Cl.
CPC .................................... *H04H 60/04* (2013.01)
USPC .......................................... 381/119; 381/104

(58) Field of Classification Search
CPC ...... H04H 60/04; G11B 27/038; G11B 27/36; H04S 2400/13
USPC ................. 381/119, 104, 120, 56, 58, 80, 61; 369/4
See application file for complete search history.

(56) References Cited

U.S. PATENT DOCUMENTS

| | | | | |
|---|---|---|---|---|
| 2003/0086580 | A1* | 5/2003 | Hamamatsu | 381/119 |
| 2005/0054305 | A1* | 3/2005 | Hagiwara et al. | 455/126 |
| 2006/0015198 | A1 | 1/2006 | Okabayashi et al. | |
| 2006/0215857 | A1* | 9/2006 | Hirano | 381/119 |

FOREIGN PATENT DOCUMENTS

| | | | |
|---|---|---|---|
| EP | 1306993 | A2 | 5/2003 |
| EP | 1513277 | A2 | 3/2005 |
| JP | 06-167970 | A | 6/1994 |
| JP | 2006-033166 | A | 2/2006 |
| JP | 2007-74110 | A | 3/2007 |
| JP | 4107243 | B2 | 6/2008 |
| JP | 4232703 | B2 | 3/2009 |

OTHER PUBLICATIONS

EP OA issued Jun. 25, 2013 for corres. EP 11190246.6.

Extended European Search Report for corresponding EP 11190246.6. Mail date Jan. 19, 2012.

Japanese Office Action for corresponding JP 2010-261819, mail date Apr. 8, 2014. English translation provided.

* cited by examiner

*Primary Examiner* — Vivian Chin
*Assistant Examiner* — Ammar Hamid
(74) *Attorney, Agent, or Firm* — Rossi, Kimms & McDowell LLP

(57) ABSTRACT

In a digital audio mixer and a method thereof, three effecter group lists corresponding to effecter group switches can be stored in a current memory. The first effecter group list can include member data identifying a plurality of effecters that constitute an effecter group. Each of the member data can include an effecter ID (eID) identifying an effecter (internal effecter, external effecter or default effecter) inserted in a desired insertion point of a desired channel. In response to operation of any one of the effecter group switches, a CPU can collectively set ON/OFF states of all of the effecters of the effecter group to a same state on the basis of the first effecter group list.

9 Claims, 4 Drawing Sheets

DIGITAL AUDIO MIXER AND METHOD THEREOF

BACKGROUND

The present invention relates to digital audio mixers having an effecter insertion function and methods thereof.

Heretofore, digital audio mixers (hereinafter also referred to simply as "digital mixers" or "mixers") having an effecter insertion function have been known, which include a plurality of effecters incorporated therein, and in which an effecter selected from among the plurality of effecters is inserted into an insertion point on an audio signal path so that the inserted effecter can be used. Via an insertion managing screen, a user can select an insertion point in a desired channel and select an effecter to be inserted into the insertion point.

On the insertion managing screen of the known digital mixers, there is provided an "insertion button" operable to switch between inserting of an effecter into an insertion point and bypassing insertion, into an insertion point, of an effecter. More specifically, when the insertion button is ON, an effecter is inserted into the insertion point, while, when the insertion button is OFF, insertion of an effecter into the insertion point is bypassed so that the effecter is not inserted into the insertion point.

Further, in the conventionally-known digital mixers, an effecter ON/OFF button operable to switch between "enabling" and "disabling" of effect processing is provided on each of various operation screens pertaining to various effecters. More specifically, when the effecter ON/OFF button is ON, the effecter in question is enabled so that a sound effect is imparted by the effecter to an audio signal in the insertion point, while, when the effecter ON/OFF button is OFF, the effecter in question is disabled so that an audio signal in the insertion point is passed through the effecter without being imparted with a sound effect by the effecter (see, for example, Japanese Patent Nos. 4232703 and 4107243).

Further, there has been known a digital mixer having a "channel link function". The channel link function is a function in accordance with which one channel link group is constituted by a plurality of desired channels and a desired parameter, such as an equalizer, compressor or fader, is caused to operate in an interlinked or interlocked fashion among or across the channels belonging to the channel link group (see, for example, Japanese Patent Application Laid-open Publication No. 2007-074110.

The conventionally-known channel link function is designed to interlink, among the channels, a parameter provided as standard in each of the channels, but it is not designed to interlink a parameter (e.g., effecter ON/OFF) among a plurality of effecters inserted in desired channels. Therefore, with the conventionally-known technique, the plurality of effecters inserted in the desired channels cannot be simultaneously turned on or off (i.e., set to an ON or OFF state) through just single user's operation.

For example, in some case, a particular acoustic effect (e.g., acoustic effect called "radio voice") is created with a combination of a plurality of effecters. In order to switch between ON and OFF states of the particular acoustic effect, however, it has heretofore been necessary to perform ON/OFF switching operation separately for each of the plurality of effecters.

In view of the foregoing prior art problems, there is a need for an improved digital mixer that allows ON/OFF parameters of a plurality of effecters, inserted in a plurality of channels, to operate in an interlocked fashion across the channels. The present application addresses this need.

SUMMARY OF THE INVENTION

One aspect of the present disclosure is a digital audio mixer that has a plurality of channels each adapted to process audio signals, each channel having an effecter switch adapted to switch an effecter in/out of the respective channel, and an effecter group switch section adapted to collectively switch a user defined plurality of the effecter switches.

Another aspect is a digital audio mixer that has an input section that receives audio signals, a signal processing section that has a plurality of channels and that performs signal processing on the audio signals, received via the input section, separately for individual ones of the channels, an output section that outputs output signals of the signal processing section, a plurality of effecters implemented by signal processing performed by the signal processing section, an effecter insertion section that, in response to an effecter insertion instruction given by a user, inserts one or more effecters, selected from among the plurality of effecters, into one or more desired insertion points on signal paths of desired one or more of the plurality of channels, an effect processing ON/OFF control section that stores therein ON/OFF parameters for individual ones of the plurality of effecters. When the ON/OFF parameter for one of the effecters, inserted by the effecter insertion section, is ON, the effect processing ON/OFF control section enables effect processing of the effecter while, when the ON/OFF parameter for the effecter is OFF, the effect processing ON/OFF control section disables the effect processing of the effecter. The mixer also includes an effecter group setting section that, in response to effecter group designation by the user, sets, as one effecter group, a plurality of effecters inserted into one or more channels designated by the user from among the plurality of channels, and an effecter group ON/OFF control section that, in response to an effecter group ON instruction given by the user, collectively sets, to an ON state, the ON/OFF parameters for the plurality of effecters belonging to the effecter group, and that, in response to an effecter group OFF instruction given by the user, collectively sets, to an OFF state, the ON/OFF parameters for the plurality of effecters belonging to the effecter group.

A plurality of effecters, inserted into desired insertion points of desired one or more of the channels, can be set up as one effecter group (or grouped into an effecter group), and the ON/OFF parameters of the plurality of effecters belonging to the one effecter group can be collectively set to the ON or OFF state in response to a user's effecter group ON instruction. Thus, the present invention can achieve the advantageous benefit that the plurality of effecters, inserted into desired insertion points of the one or more desired channels, can be simultaneously set to the ON or OFF state (i.e., turned on or off) through one instruction operation by the user. In other words, the ON/OFF parameters of the plurality of effecters inserted in the plurality of desired channels can be caused to operate in an interlocked fashion across the channels. Namely, when a sound effect is to be created with a combination of a plurality of effecters, and if the plurality of effecters to be used for achieving the sound effect are grouped into one group, the present invention allows the sound effect to be set ON or OFF through single user's operation.

Another aspect is a method of operating the digital mixer. The method can include the steps of defining a group of effecter switches by a user, and collectively switching the defined group of effecter switches.

The following will describe embodiments of the present invention, but it should be appreciated that the present invention is not limited to the described embodiments and various modifications of the invention are possible without departing from the basic principles. The scope of the present invention is therefore to be determined based on the claims.

BRIEF DESCRIPTION OF THE DRAWINGS

Certain preferred embodiments of the present invention will hereinafter be described in detail, by way of example only, with reference to the accompanying drawings, in which.

DETAILED DESCRIPTION

An embodiment of a digital audio mixer of the present invention to be described below with reference to the accompanying drawings has an effecter function for inserting a desired effecter into a desired insertion point of a desired audio signal path.

Figure 1:
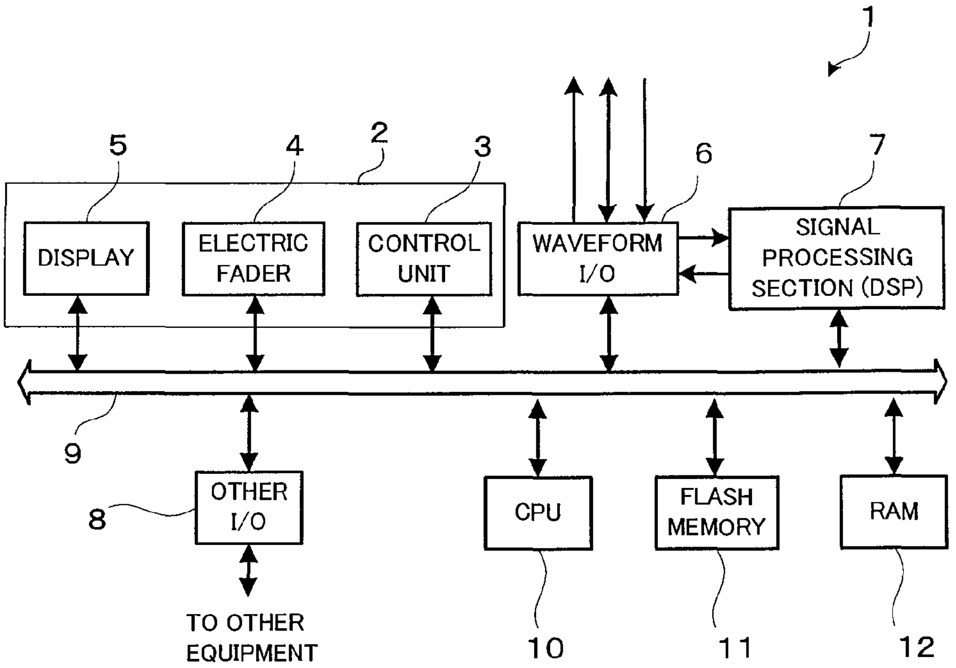
FIG. 1 is a block diagram showing an example electrical hardware setup of an embodiment of a digital audio mixer of the present invention.

As shown in FIG. 1, the digital audio mixer (hereinafter also referred to simply as "digital mixer" or "mixer") 1 includes a CPU (Central Processing Unit) 10, a flash memory 11, a RAM (Random Access Memory) 12, a control unit 3, an electric fader group 4, a display device 5, a waveform input/output interface (waveform I/O) 6, a signal processing section (DSP (Digital Signal Processing) section) 7 and other I/Os 8, and these components are interconnected via a bus 9.

The CPU 10 controls general behavior of the digital mixer 1 by executing control programs stored in the flash memory 11 or RAM 12. The flash memory 11 is a non-volatile memory storing therein various programs for execution by the CPU 10 and various data for reference by the CPU 10. The RAM 12 is a volatile memory for use as a loading area of a program to be executed by the CPU 10 and as a working area for the CPU 10. The flash memory 11 includes a current memory storing therein current values (current settings) of all parameters for use in signal processing.

The control unit 3, electric fader group 4 and display device 5 are user interfaces provided on an operation panel 2 of the mixer 1. The display device 5 is in the form of a touch-panel type display operable by a human operator or user to make desired input through touch operation on the display panel, and it can display various screens on the basis of display control signals given from the CPU 10 via the bus 9. The control unit 3 and electric fader group 4 comprise groups of controls provided on the operation panel. More specifically, the electric fader group 4 comprises fader-type controls that are operable by the user and whose operating positions can be automatically controlled on the basis of drive control signals given from the CPU 10. In response to user's operation of the control unit 3, electric fader group 4 and touch-panel type display device 5, the CPU 10 adjusts current data. In this specification, operation for "adjusting (changing) current data" means changing current data stored in the current memory and corresponding to the operation, to a value corresponding to the operation and reflecting the changed value in the DSP section 7 and display device 5.

The waveform I/O 6, which is an interface for inputting and outputting audio signals, comprises a plurality of input ports for inputting analog and digital audio signals from external equipment, and a plurality of output ports for outputting analog and digital audio signals to external equipment, as indicated by arrows in the figure. The waveform I/O 6 also includes mechanisms for performing analog-to-digital (A/D) conversion, digital-to-analog (D/A) conversion and digital conversion (i.e., format conversion). Further, the digital mixer 1 is connectable with other peripheral equipment via the other interfaces 18.

The DSP section 7 performs digital signal processing on an audio signal input via the waveform I/O 6 on the basis of current data of various parameters stored in the current memory, by executing various microprograms on the basis of instructions given by the CPU 10. Then, the DSP section 7 outputs the thus-processed audio signal via the waveform I/O 6. The signal processing (mixing algorithm) performed by the DSP section 7 includes various processing, such as sound characteristics (sound volume level and sound quality) adjustment processing to be performed for each of a plurality of channels, mixing processing for mixing signals of the plurality of channels, effect impartment processing, etc. The DSP section 7 may comprise either only one DSP (Digital Signal Processor), or a plurality of DSPs interconnected via a bus so that the signal processing can be performed distributedly by the plurality of DSPs.

Figure 2:
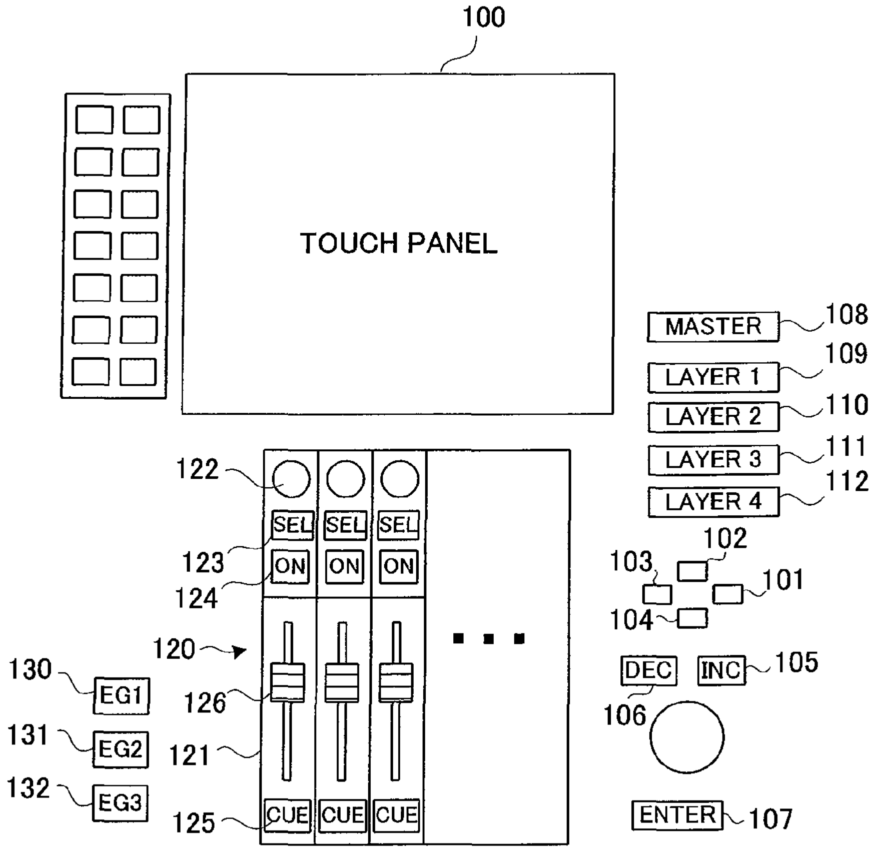
FIG. 2 is a plan view showing principal sections of an operation panel employed in the mixer of FIG. 1.

FIG. 2 shows an example construction of principal sections of the operation panel 2, which generally comprises a touch panel 100 and a channel strip section 120 that correspond to the control unit 3, electric fader group 4 and display device 5 of FIG. 1. The touch panel 100 is a display via which the user can make desired input by performing touch operation on its screen; this touch panel 100 displays various screens including a later-described channel effecter setting screen. Let it be assumed here that the touch panel 100 has a greater width (horizontal dimension) than the channel strip section 120; this is because each screen displayed on the panel 100 has to match a layout of various elements of the channel strip section 120. Cursor keys 101 to 104 are operable to move a cursor in up-down and left-right directions on the touch panel 100. Increment and decrement keys 105 and 106 are operable to increase or decrease a numerical value or the like marked by the cursor. An ENTER key 107 is operable to determine or confirm a numerical value, instruction or the like marked by the cursor.

Layers, each comprising 12(twelve) channels, are allocated to layer selection switches 108-112. Any one of the layer selection switches 108-112 is selectively turned on so that one layer corresponding to the turned-on layer selection switch is selected as an object of display on a channel overview screen on the touch panel 100 and as an object of control by the channel strip section 120.

In the illustrated example, the mixer 1 includes 48 (forty-eight) input channels in CH1-inCH48 and 12 (twelve) output channels outCH1-outCH12. The output channels outCH1-outCH12 are allocated to the "master" switch 108, the input channels inCH1-inCH12 are allocated to the "layer 1" switch 109, the input channels inCH13-inCH24 are allocated to the "layer 2" switch 110, the input channels inCH25-inCH36 are allocated to the "layer 3" switch 111, and the input channels inCH37-inCH48 are allocated to the "layer 4" switch 112.

The channel strip section 120 comprises 12 (twelve) channel strips 121 arranged horizontally in parallel to one another. 12 input or output channels selected via any one of the layer selection switches 108-112 are allocated to the channel strips 121. Each of the channel strips 121 includes a rotary encoder 122 to which is allocatable one parameter selected on the touch panel 100, a SEL switch 123 for selecting, as a selected channel, the channel in question, a channel ON/OFF switch 124 for switching between ON and OFF states of the channel, a CUE switch 125 for selecting a channel to be CUE-monitored, and a fader control 126 corresponding to the electric fader 4 of FIG. 1.

Three effecter group switches ("EG1", "EG2" and "EG3") 130 to 132 correspond to later-described effecter groups, and each of the effecter group switches 130 to 132 is constructed to collectively change the ON/OFF states of a plurality of effecters belonging to the corresponding effecter group in response to user's operation of the effecter group switch. Each of the effecter group switches 130 to 132 is in the form of a self-illuminating button having a light emitting element (e.g., LED) incorporated therein, which is turned on or illuminated when the corresponding effecter group is in an effecter-ON state and turned off or deilluminated when the corresponding effecter group is in an effecter-OFF state. Each of the effecter group switches 130 to 132 is also used (operable) when an effecter is to be added to the corresponding effecter group or an effecter is to be removed from the corresponding effecter group.

Figure 3:
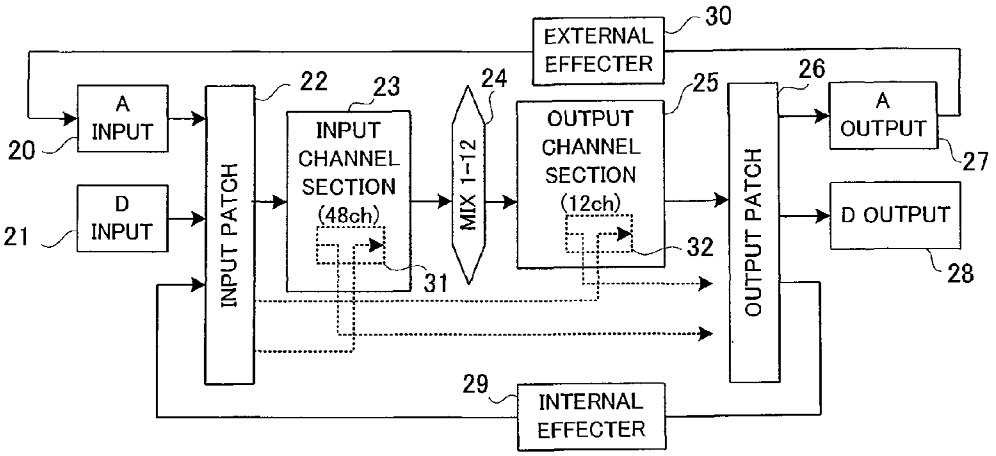
FIG. 3 is a block diagram explanatory of a signal processing construction for audio signal processing performed by the mixer of FIG. 1.

FIG. 3 is a block diagram explanatory of a construction for signal processing performed on audio signals by the waveform I/O 6 and DSP section 7 of FIG. 1. In FIG. 3, an analog input section ("A input") 20 and digital input section ("D" input) 21 correspond to audio signal input functions, such as audio signal input, A/D conversion and format conversion, performed by the waveform I/O 6.

On the basis of input patch data stored in the current memory, an input patch section 22 connects each of a plurality of input ports, provided in the A input 20 and D input 21, to any of input channels of an input channel section 23 (for convenience of explanation, the input channels too are sometimes indicated by the reference numeral 23) provided at a stage succeeding the A input 20 and D input 21. Namely, the CPU 10 changes input patch data, stored in the current memory, in response to patch designating operation by the user, to thereby allocate each of the input channels of the A input 20 and D input 21, which are signal supply sources to the input patch section 22, to an input channel 23 that becomes a signal output destination for the input port. The input patch section 22 also makes a connection for inserting a later-described internal effecter 29 and outer effecter 30 to insertion points of an input or output channel 23 or 25.

The input channel section 23 comprises 48 (forty-eight) input channels (inCH1-inCH48). Each of these input channels of the input channel section 23 includes various setting parameters for use in, among others, an output selection section that controls ON/OFF of output to an attenuator, equalizer, compressor, pan and individual buses, and a send level adjustment section that controls or adjusts output levels to the individual buses. Each of the input channels 23 performs, on the basis of later-described channel data of FIG. 6, various signal processing on an audio signal input thereto via the input patch section 22, and then it outputs the resultant processed audio signal to one or more MIX buss 24.

Each of 12 (twelve) MIX buses of the MIX bus section 24 (for convenience of explanation, the MIX buses too are sometimes indicated by reference numeral 24) mixes together audio signals supplied from a plurality of the input channels 23 and outputs the resultant mixed audio signal to an output channel section 25 provided at a stage succeeding the MIX bus section 24. The output channel section 25 includes 12 output channels (outCH1-outCH12) (for convenience of explanation, the output channels too are sometimes indicated by reference numeral 25) corresponding to the 12 MIX buses 24, and each of the output channels 25 includes various setting parameters, such as a limiter, compressor, equalizer and fader. Each of the channels 25 performs various signal processing on the audio signal, supplied from the corresponding MIX bus 24, on the basis of later-described channel data of FIG. 6.

An output patch section 26 connects each of the output channels of the output channel section 25 to any of a plurality of output ports provided in an analog output section (A output) 27 and in a digital output section (D output) 28. Namely, the CPU 10 changes output patch data, stored in the current memory, in response to patch designating operation by the user, to thereby allocate each of the output channels of the output channel section 25 that are signal supply sources to the output patch section 26, to any of the output ports of the A output 27 or D output 28 that becomes a signal output destination for the output channel The output patch section 26 also makes a connection for inserting a later-described internal effecter 29 and outer effecter 30 to insertion points of an input or output channel 23 or 25. The A output 27 and D output 28 correspond to audio signal output functions, such as audio signal A/D conversion, format conversion and output functions, performed by the waveform I/O 6.

The internal effecter 29 is an effecter implemented by signal processing performed within the DSP section 7. A plurality of (e.g., 96) internal effecters 29 are incorporated in the mixer 1. More specifically, a plurality of microprograms are stored in the flash memory 11 of the mixer 1 for implementing the 96 internal effecters 29, and the programs of the internal effecters 29 are transferred to the DSP section 7 as necessary. The user inserts an internal effecter, selected from among the 96 internal effecters 29, into a desired insertion point of a desired channel so that the inserted internal effecter can be used in the insertion point of the channel. On the basis of later-described internal effecter data (various setting parameters for the internal effecters) of FIG. 7, the DSP section 7 performs effect processing by means of the internal effecters 29 inserted in the individual channels. In this specification and accompanying drawings, the "internal effecter" is sometimes indicated as "internal EF" or "iEF", or by a letter string "iEF" with a numerical value, like "iEF3", to distinguish a particular internal effecter from the other interior effecters.

The external effecter 30 is an effecter implemented by external equipment independent of the mixer 1, which has an input terminal connected to the A output 27 and an output terminal to the A input 20. By the user setting insertion of the external effecter 30 (i.e., insertion-setting the external effecter 30) into a desired insertion point of a desired channel, the thus-inserted external effecter 30 can be used in the insertion point of the channel Values of various setting parameters to be used in effect processing by the external effecter 30 are controllable by the external effecter 30, but cannot be controlled via the operation panel 2 of the mixer 1. In this specification and accompanying drawings, the "external effecter" is sometimes indicated by "external EF" or "eEF". Note that, if the external effecter 30 includes digital input and output terminals, such input and output terminals can be connected to the D output 28 and D input 21.

Broken-line blocks 31 and 32 in FIG. 3 show an internal effecter 29 and external effecter 30 inserted and set in the input channel section 23 and output channel section 25, respectively. Once an internal effecter 29 is inserted into an insertion point or insertion of an external effecter 30 is set into an insertion point, the output patch section 26 connects the output of the insertion point (so-called "insert-out") to the input side of the inserted internal effecter 29 or to an output port (A output 27) connected to an input terminal of the insertion-set external effecter 30. Further, the input patch section 22 connects the input of the insertion point (so-called "insert-in") to the output side of the inserted internal effecter 29 or to an input port (A input 20) connected to an output terminal of the insertion-set external effecter 30. Broken-line arrows indicate audio signal paths within the DSP section 7 that send an audio signal from the insert-out to the output patch section 26 and return an audio signal from the input patch section 22 to the insert-in.

Figure 4:
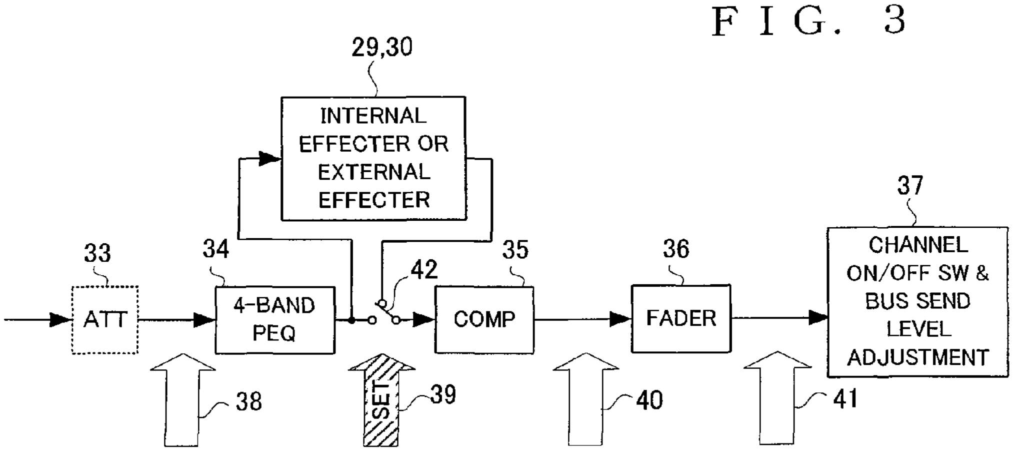
FIG. 4 is a block diagram explanatory of how an effecter is inserted into a channel shown in FIG. 3.

FIG. 4 is a diagram explanatory of an example manner in which an effecter is inserted into one of the channels of the input channel section 23 or output channel section 25. The channel includes, as signal processing modules related to various setting parameters, an ATT (attenuator) 33, a four-band PEQ (Parametric Equalizer) (hereinafter also referred to as "PEQ") 34, a COMP (compressor) 35, a fader 36, and a channel ON/OFF switch and bus send level adjustment section 37. Of these signal processing modules, the four-band PEQ 34 and COMP 35 are "default effecters" that are effecters implemented through signal processing by the DSP section 7. Such default effecters are fixedly provided in advance, as standard, in predetermined positions on a signal path of each of the channels. The user cannot change the types and positions, on the signal path, of such default effecters. In the specification and accompanying drawings, the default effecter is sometimes indicated also as "dEF". Note that the ATT 33 indicated by broken line is provided only in the input channel 23.

Reference numerals 38 to 41 indicate portions of the channel where insertion points can be set. The user can set insertion points in a plurality (two at the maximum in the illustrated example) of the four portions 38 to 41. Into each of the insertion points can be set one or more internal effecters 29, or can be insertion-set one external effecter 30. The reason why the number of the insertion points capable of being set into each channel is limited is that there are only a limited number of patching resources for connecting the insertion points and the effecters.

When an effecter (internal effecter 29 or external effecter 30) has been inserted into an insertion point set in any one of the channels, the audio signal path of the channel is cut off at the thus-set insertion point (portion indicated at 39 in the illustrated example of FIG. 4), and the output (insert-out) of the insertion point is connected, by the output patch section 26, to the input side of the inserted effecter (internal effecter 29 or external effecter 30) and the output side of the inserted effecter is connected, by the input patch section 23, to the input (insert-in) of the insertion point, as noted above. In this manner, effect processing of the inserted effecter can be inserted into the portion, on the audio signal path of the desired channel, corresponding to the desired insertion point.

An insertion setting ON/OFF switch 42 is provided at the insertion point for switching between insertion setting ON and OFF states of an external effecter 30. The insertion setting ON/OFF switch 42 is ON/OF-controlled on the basis of current data of an insertion setting ON/OFF parameter stored in the current memory. When the insertion setting ON/OFF switch 42 is ON, it establishes a path for returning an output signal of the external effecter 30 to the insertion point, while, when the insertion setting ON/OFF switch 42 is OFF, it establishes a path for bypassing the external effecter 30 to thereby disable insertion setting, into the insertion point, of the external effecter 30.

For example, when an insertion point is set between the PEQ 34 and the COMP 35 and the insertion setting ON/OFF switch 42 is ON, as shown in FIG. 4, the output of the PEQ 34 is coupled to the input of an effecter (internal effecter 29 or outer effecter 30) inserted in the insertion point, and the output of the inserted effecter is coupled to the input of the COMP 35.

Figure 5:
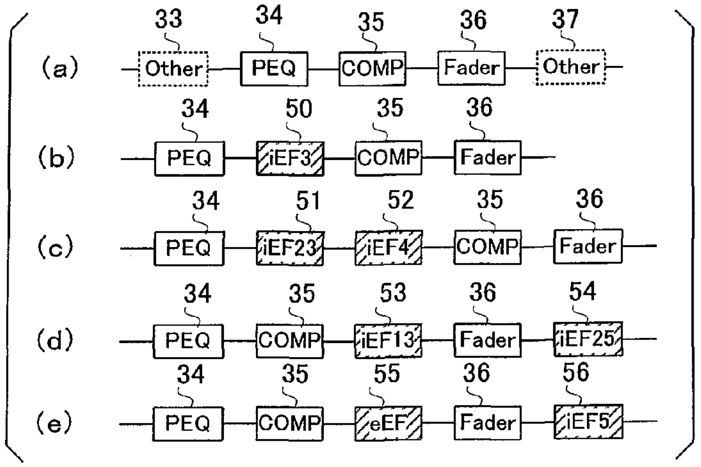
FIG. 5 is a diagram explanatory of various example signal processing constructions of the channel shown in FIG. 4, of which (a) shows an example signal processing construction when no effecter is inserted in the channel, (b) shows an example signal processing construction when one effecter is inserted in the channel and (c), (d) and (e) show example signal processing constructions when two effecters are inserted in the channel.

(a) of FIG. 5 shows an example of a signal processing construction employed when no effecter is inserted in the channel shown in FIG. 4. Blocks "Other" indicated by reference numerals 33 and 37 in (a) of FIG. 5 correspond to the ATT 33 and channel ON/OFF switch and bus send level adjustment section 37 shown in FIG. 4. In this case, a signal input to the channel is sequentially subjected to processing by the ATT 33, PEQ 34, COMP 35, fader 36 and channel ON/OFF switch and bus send level adjustment section 37, and then the resultant processed signal is output from the channel.

(b) of FIG. 5 shows an example of a signal processing construction employed when one effecter is inserted in one channel, and (c) to (e) of FIG. 5 show examples of signal processing constructions employed when two effecters are inserted in one channel. Each inserted effecter (internal effecter 29 or external effecter 30) is indicated by hatching. Note that illustration of the blocks 33 and 37 is omitted in (b) to (e) of FIG. 5.

When one internal effecter (block "iEF3" indicated by reference numeral 50) is inserted in an insertion point between the PEQ 34 and COMP 35 as shown in (b) of FIG. 5, an output signal of the PEQ 34 is input to the internal effecter (block "iEF3") 50, and an output signal of the internal effecter 50 is input to the COMP 35.

Further, when two internal effecters (block "iEF23" indicated by reference numeral 51 and block "iEF4" indicated by reference numeral 52) are inserted in an insertion point between the PEQ 34 and COMP 35 as shown in (c) of FIG. 5, an output signal of the PEQ 34 is input to the internal effecter (block "iEF23") 51, an output signal of the internal effecter 51 is input to the effecter (block "iEF4") 52 following the internal effecter 51, and an output signal of the block "iEF4" is input to the COMP 35. Further, when one internal effecter (block "iEF13" indicated by reference numeral 53) is inserted in an insertion point between the COMP 35 and the fader 36 and one internal effecter (block "iEF25" indicated by reference numeral 54) is inserted in an insertion point immediately following the fader 36 as shown in (d) of FIG. 5, an output signal of the COMP 35 is input to the internal effecter (block "iEF13") 53, an output signal of the internal effecter (block "iEF13") 53 is input to the fader 36, and an output signal of the fader 36 is input to the internal effecter (block "iEF25") 54.

Furthermore, when one external effecter (block "eEF" indicated by reference numeral 55) is insertion-set in an insertion point between the COMP 35 and the fader 36 and one internal effecter (block "iEF5" indicated by reference numeral 56) is inserted in an insertion point immediately following the fader 36 as shown in (e) of FIG. 5, an output signal of the COMP 35 is input to the external effecter (block "eEF") 55, an output signal of the "eEF" is input to the fader 36 of the channel, and an output signal of the fader 36 is input to the internal effecter (block "iEF5") 56. Although the "eEF" block 55 is depicted on the signal path in (e) of FIG. 5, effect processing of the "eEF" is performed by an external effecter externally connected to the mixer 1.

Figure 6:
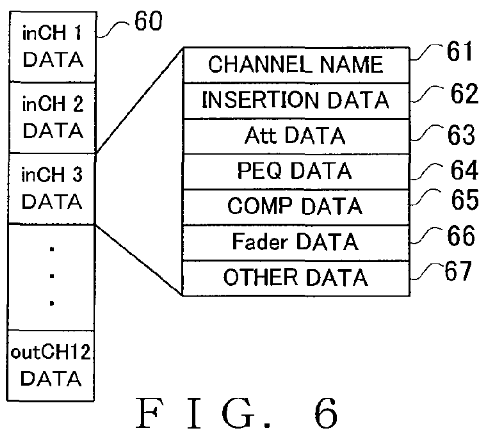
FIG. 6 is a diagram showing an example structure of channel data stored in a current memory within a flash memory of FIG. 2.

Channel-by-channel signal processing (see the signal processing for one channel shown in FIG. 4) performed by the DSP section 7 is controlled on the basis of the corresponding channel data. FIG. 6 shows an example structure of the channel data stored in the current memory. In the current memory are stored the channel data 60 for all of the channels (i.e., 48 input channels and 12 output channels) provided in the mixer 1, i.e. inCH1 data, inCH2 data, inCH3 data,, . . . inCH48 data, and outCH1 data, . . . outCH12 data.

The channel data for each of the channels include channel name data 61 of the channel, insertion data 62 related to an effecter insertion function of the channel, and various setting parameters for various signal processing modules provided in the channel; in the case of the channel data "inCH3 data", the setting parameters include Att data 63, PEQ data 64, Comp data 65, Fader data 66 and other data 67. Of the setting parameters for various signal processing modules, data of each of the default effecter data (i.e., PEQ data 64 and Comp data 65) include an ON/OFF parameter of the default effecter.

The insertion data 62 are parameters related to effecter insertion into individual insertion points (two portions at the maximum in the instant embodiment) set in the channel in question, and such insertion points will hereinafter be referred to as "insertion 1" and "insertion 2". The insertion data 62 include data identifying positions of the individual insertion points in the channel, and data related to effecters inserted in the insertion points. When one or more internal effecters 29 are inserted in an insertion point, the insertion data 62 include data identifying the inserted one or more internal effecters, and data identifying order in which the one or more internal effecters are interconnected. If an external effecter 30 is inserted in an insertion point, on the other hand, the insertion data 62 include data indicating that the external effecter is insertion-set in the insertion point, and an insertion setting ON/OFF parameter of the insertion point.

Figure 7:
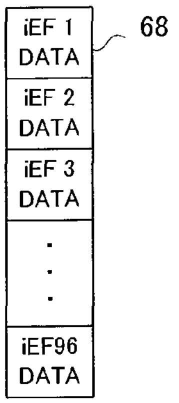
FIG. 7 is a diagram showing an example structure of internal effecter data stored in the current memory of FIG. 2.

FIG. 7 shows an example structure of data of the internal effecters 29 (internal effecter data) stored in the current memory. More specifically, internal effecter data 68 (i.e., 96 sets of internal effecter data "iEF1" to "iEF96") are stored in the current memory in association with the plurality of (96 in the instant embodiment) internal effecters 29 incorporated in the mixer 1. Each of the sets of internal effecter data 68 includes current data of various parameters for use in effect processing of the internal effecter, and an ON/OFF parameter of the internal effecter. Namely, when an internal effecter is inserted in a given channel, it is possible to identify, on the basis of the insertion data 62 of the channel data 60, which internal effecter is inserted in which insertion point of the channel. Thus, the DSP section 7 performs effect processing of the inserted internal effecter at the identified insertion point of the channel by use of the identified internal effecter data 68.

Figure 8:
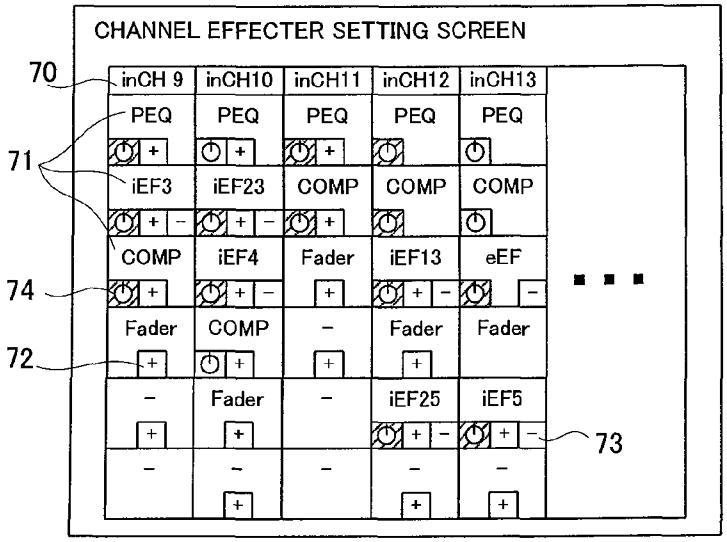
FIG. 8 is a diagram showing a channel effecter setting screen displayed on a touch panel shown in FIG. 2.

The user performs, via a channel effecter setting screen, various setting operation related to the effecter insertion function, such as operation for setting insertion points for the individual channels, operation for selecting an effecter to be inserted into a desired insertion point of each of the channels, and the like. In response to a user's instruction, the CPU 10 displays a channel effecter setting screen on the touch panel 100 (FIG. 2) of the operation panel. FIG. 8 shows an example configuration of the channel effecter setting screen, on which a signal processing construction is displayed for each of a predetermined plurality of (12 in the illustrated example of FIG. 8) channels on the basis of the channel data (inCH1 data, inCH2 data, inCH3 data,, . . . outCH1 data, . . . outCH12 data) of FIG. 6. The 12 channels to be displayed on the channel effecter setting screen may be selected, for example, by operation of any one of the layer selection switches 108 to 112 (FIG. 2), or by scrolling of the display of FIG. 8 in a left-right direction.

The channel names of the 12 currently-displayed channels are displayed in an uppermost horizontal row of the channel effecter setting screen. Below each of the channel names are displayed small rectangular boxes (or cells), showing a signal processing construction of the channel, arranged in a vertical row. In each of the rectangular boxes 71 is displayed the name of a signal processing module (e.g., "PEQ", "iEF3", "COMP", "Fader", "eEF" or the like) corresponding to that box. Vertically-arranged order of the rectangular boxes 71 of each of the channels corresponds to signal processing order of the channel; that is, the uppermost rectangular box 71 is the first (or upstream-most) signal processing module in the signal processing order. From the display of the channel effecter setting screen, the user can know each of the signal processing constructions of the individual channels, position of each of insertion points set in the individual channels, and a type of each of effecters inserted in the individual channels. Note that displayed positions of the individual channels (vertical rows of the rectangular boxes 71) on the channel effecter setting screen correspond to disposed positions of the 12 channel strips 121 (FIG. 2) of the channel strip section 120 provided below the touch panel 100.

For convenience of illustration, FIG. 8 only shows information of five input channels "inch9", "inch10", "inch11", "inch12" and "inch13". "inch9" corresponds to the signal processing construction shown in (b) of FIG. 5, "inch10" corresponds to the signal processing construction shown in (c) of FIG. 5, "inch11" corresponds to the signal processing construction shown in (a) of FIG. 5, "inch12" corresponds to the signal processing construction shown in (d) of FIG. 5, and "inch13" corresponds to the signal processing construction shown in (e) of FIG. 5.

GUI components 72 to 74 for making settings related to the effecter insertion function are displayed in each of the rectangular boxes 71.

The insertion setting button 72 instructs insertion of a new effecter. If a new effecter can inserted into a stage immediately preceding the signal processing module in question, then the insertion setting button 72 is displayed in the rectangular box 71. A plurality of internal effecters can be implemented within an internal effecter 29, and thus, even if an effecter is currently inserted in a given insertion point, another internal effecter can be additionally inserted into the given insertion. Thus, the insertion setting button 72 is displayed in the rectangular box 71 corresponding to the internal effecter 29, e.g. third rectangular box "iEF3" from the top of "inCH9". Further, such an insertion setting button 72 is not displayed in the rectangular box 71 corresponding to an external effecter 30, e.g. second rectangular box "eEF3" from the top of "inCH13". Further, if an external effecter has been inserted in an insertion point, another effecter cannot be additionally inserted into that insertion point, because that insertion point is dedicated to the external effecter. Further, in the example screen configuration of FIG. 8, the number of empty rectangular boxes for each of the channels is set at three, so that the number of effecters insertable is limited to three at the maximum. If effecters have been set into all of the rectangular boxes in a given channel, the insertion setting button 72 is no longer displayed in any of the rectangular boxes of the given channel.

The insertion cancellation button 73, which is operable to cancel insertion of an effecter into an insertion point, is displayed in the rectangular boxes 71 corresponding to internal and external effecters 29 and 30.

The ON/OFF button 74 switches between ON and OFF states of an effecter corresponding to the rectangular box 71, a display style of the ON/OFF button 74 is changed according to the current ON/OFF state of the effecter corresponding to the box 71. In FIG. 8, the button 74 in the ON state is indicated by a hatched style, while the button 74 in the OFF state is indicated by a white-out style. The ON/OFF button 74 is displayed in each of the rectangular boxes 71 corresponding to any one of the effecters (internal effecter, external effecter and default effecter), but not displayed in any one of the rectangular boxes 71 corresponding to other than the effecters, such as "Fader".

Figure 9:
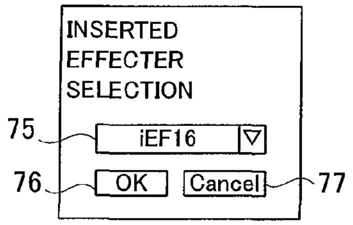
FIG. 9 is a diagram showing a dialog box for selecting an effecter to be inserted.

Once the insertion setting button 72 is operated by the user, the CPU 1 adds a new rectangular box 71 below the rectangular box 71 to which the currently-operated insertion setting button 72 belongs, and displays an inserted effecter selection popup dialog box of FIG. 9 on the touch panel 100. The dialog box of FIG. 9 includes a drop-down list 75 enumerating all insertable effecters, which is basically a list of all internal effecters 29 and external effecters 30 as options of insertion-setting. Once the user selects a desired one effecter from the drop-down list 75 and depresses an OK button 76, the CPU 10 inserts the selected internal effecter 29 into a new insertion point or sets insertion of the selected external effecter into the new insertion point. Also, the CPU 10 displays the name and necessary GUI component in the new rectangular box 71. When the external effecter 30 has been inserted and set, the COU 10 makes patch settings between input and output ports (A output 27 and A input 20) to which the external effecter 30 is to be connected and the insertion point (insert-out and insert-in). Once a CANCEL button 77 is operated, the COU 10 closes the dialog box without effecting insertion of the current effecter.

Figure 10:
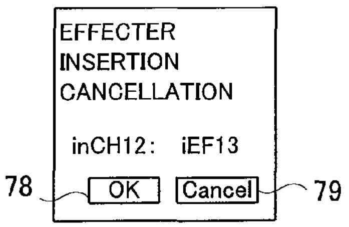
FIG. 10 is a diagram showing a dialog box for canceling insertion of an effecter.

Further, one the user operates an insertion cancellation button 73, the CPU 10 displays an effecter insertion cancellation box shown in FIG. 10. In the effecter insertion cancellation box are displayed the channel name of a channel, which an insertion point to be subjected to current effecter insertion cancellation belongs to and the names of the effecters ("inCH12" and "iEF13" in the illustrated example of FIG. 10). In response to operation of an OK button 78, the CPU cancels the insertion of the effecter, deletes the rectangular box 71 which the insertion cancellation button 73 belongs to and moves the rectangular box 71, located immediately beneath the deleted rectangular box, upward to the position where the deleted box 71 existed. Further, once the CANCEL button 79 is operated, the CPU 10 closes the dialog box without executing the insertion cancellation.

Once the ON/OFF button 74 is depressed by the user, the CPU 10 changes the ON/OFF state of the effecter (internal effecter, external effecter or default effecter) corresponding to the button 74. Further, in response to the change of the ON/OFF state of the effecter, the CPU 10 also changes the display style of the ON/OFF button 74.

More specifically, for the external effecter 30, the CPU 10 changes, in response to the user's operation of the ON/OFF button 74, the value of the insertion setting ON/OFF parameter of the insertion data 62 of the channel data 60 (see FIG. 6), to thereby change the ON/OFF state of the insertion setting switch 42 of the insertion point (see FIG. 4). Because enabling/disabling (ON/OFF) of the external effecter 30 is controlled by the insertion setting ON/OFF parameter, enabling/disabling (ON/OFF) of the external effecter 30 can be remote-controlled irrespective of which effecter is connected as the external effecter 30. Note that, in a case where a plurality of external effecters are connected in series, enabling/disabling of all of the serially-connected external effecters is collectively remote-controlled by the insertion setting ON/OFF parameter, and these serially-connected external effecters cannot be enabled/disabled separately or independently of each other.

Figure 11:
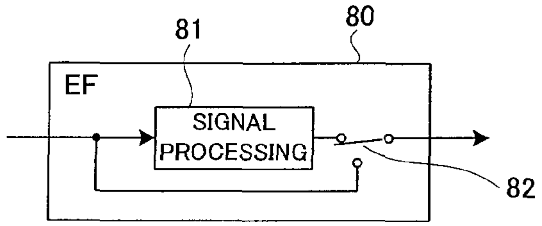
FIG. 11 is a block diagram explanatory of a signal processing construction for turning on or off an effecter.

For the internal effecter 29 and default effecters (i.e., effecters implemented by signal processing by the DSP section 7), the CPU 10 rewrites, in response to operation of the ON/OFF button 74, a value of an ON/OFF parameter of the corresponding effecter (i.e., ON/OFF parameter included in corresponding internal effecter data 68 or PEQ data 64 or Comp data 65 of corresponding channel data 60) stored in the current memory, to thereby change the ON/OFF state of the effecter. FIG. 11 is a block diagram explanatory of a construction for turning on or off the internal effecter 29 and default effecters. In FIG. 11, an ON/OFF switch 82 for the effecter in question is provided at an output stage of an effecter module 80. The ON/OFF switch 82 in the ON state establishes a signal path for outputting a result of signal processing 81 of the effecter to thereby enable the effecter, while the ON/OFF switch 82 in the OFF state establishes a signal path for causing an input signal to the effecter to bypass the signal processing 81, to thereby disable the effecter in question. For the internal effecter, enabling/disabling of each effecter is controlled locally by use of the ON/OFF parameter of the effecter, and thus, in a case where a plurality of serially-connected internal effecters are inserted in a given insertion point, individual ones of the plurality of serially-connected internal effecters can be enabled/disabled separately or independently of one another.

The user sets, as an effecter group, a desired plurality of effecters from among effecters inserted in a given channel and can collectively turn on or off the plurality of effecters belonging to the effecter group. In the instant embodiment, the user can set three effecter group corresponding to three effecter group switches (EG1) 130, (EG2) 131 and (EG3) 132. Each such effecter group comprises desired effecters inserted in one or more desired channels. Namely, a plurality of effecters inserted in different channels may be grouped into one effecter group. Further, an effecter group may comprise any one or more types of effecters, i.e. internal 24, external 30 and default 34, 35.

Figure 12:
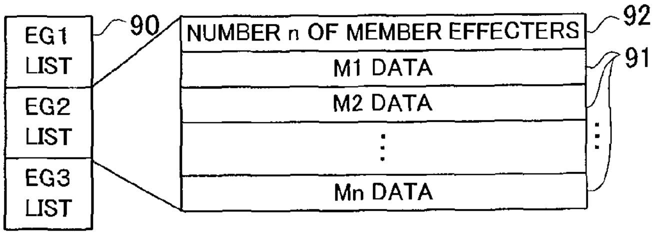
FIG. 12 is a diagram showing an example data structure of an effecter group list stored in the current memory within the flash memory of FIG. 2.

Effecters or members of the three effecter groups are managed in accordance with effecter group lists stored in the current memory. FIG. 12 shows an example data structure of the effecter group lists. The effecter group lists (EG1 list, EG2 list and EG3 list) (EG1 list, EG2 list and EG3 list) 90, each specifying effecters or members (i.e., member effecters) of one of the three effecter groups (EG1, EG2 and EG3), are stored in the current memory. Each of the group lists comprises data 92 indicative of the number n of effecters or members constituting the group ("n" indicates a positive integer corresponding to the number of members), and data indicative of the individual members 91 (member data) (M1 data, M2 data, . . . Mn data); ID data "eID" identifying the respective effecter members are stored as the individual member data 91. The plurality of member data 91 registered in each of the effecter group lists 90 are sorted, for example, in order in which they were registered (i.e., registered order). Note that the plurality of member data 91 registered in each of the effecter group lists 90 may alternatively be sorted in order of their respective "eIDs".

In the instant embodiment, there are three types of "eIDs": default effecter ID (deID) identifying a default effecter; inner default effecter ID (ieID) identifying an inner effecter; (ieID); and external default effecter ID (eeID) identifying an external effecter.

(1) "deID" comprises data identifying a channel that the member default effecter in question belongs to and a type of the default effecter. The deID is represented, for example, by a 10-bit binary number; the leading or first one bit is "0", next 7 bits indicative of "chID" identifying one of the 60 channels (i.e., 48 input channels and 12 output channels), and next 2 bits identifying a type of the default effecter (e.g. "00" indicative of "PEQ", and "01" indicative of "COMP").

(2) "ieID" comprises data identifying which one of the 96 internal effecters (iEF1-iEF96) the member internal effecter in question is. The ieID is represented, for example, by a 10-bit binary number; the leading or first one bit is "1", and next 9 bits indicative of data identifying one of the 96 internal effecters.

(3) "eeID" comprises data identifying a channel and insertion point of the channel in which the member external effecter in question is insertion-set. The eeID is represented, for example, by a 10-bit binary number; the leading or first one bit is "0", next 7 bits indicative of "chID" identifying one of the 60 channels, and next 2 bits identifying the identification point of the channel (e.g. "10" indicative of "insertion 1", and "11" indicative of "insertion 2").

By the operating any one of the effecter group switches 130 to 132 (FIG. 2) on the operation panel 2, the user can collectively turn on or off (set to the ON or OFF state) the plurality of effecters belonging to the group corresponding to the operated one of the effecter group switches 130 to 132. Let it be assumed here that the effecter group switches 130 to 132 are switched between the ON and OFF states in response to each operation thereof.

Figure 13:
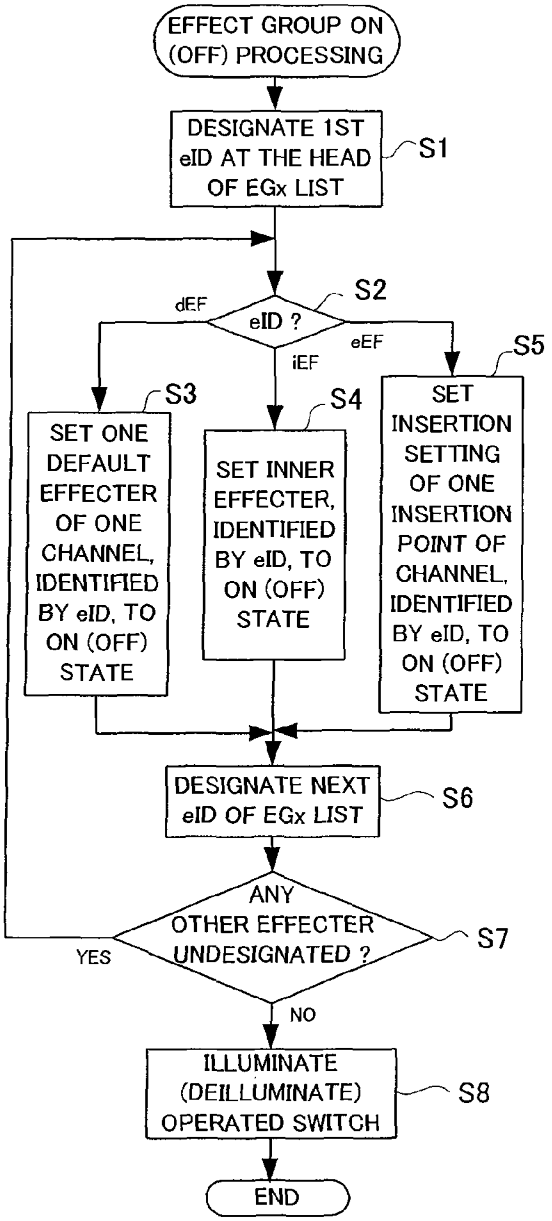
FIG. 13 is a flow chart showing an example operational sequence of effecter group ON and OFF processing.

FIG. 13 is a flow chart showing an example operational sequence of processing performed by the CPU 10 when the user has operated any one of the effecter group switches 130 to 132. First, a description will be given about processing for setting any one of the effecter groups EGx (i.e., one of EG1 to EG3) to the ON state, i.e. processing performed in response to user's operation of any one of the switches 130-132 that is in the OFF or deilluminated state.

At step S1, the CPU 10 designates, as an object of processing, the "eID" of the M1 data located at the head of the list 90 of the effecter group EGx corresponding to the operated switch 130-132.

At next step S2, the CPU 10 determines which one of the default effecter ID ("deID"), internal effecter ID ("ieID") and external effecter ID ("eeID") the type of the "eID" designated as the object of processing is.

If the type of the "eID" designated as the object of processing is "deID" as determined at step S2, the CPU 10 branches to step S3, where it sets one default effecter (PEQ or COMP indicated by the chID) of the channel identified by the "deID" to the ON state.

If the type of the "eID" designated as the object of processing is "ieID" as determined at step S2, the CPU 10 goes to step S4, where it sets an inner effecter (one of iEF1 to iEF96) identified by the "ieID" to the ON state.

If the type of the "eID" designated as the object of processing is "eeID" as determined at step S2, the CPU 10 branches to step S5, where it sets the insertion setting of one insertion point ("insertion 1" or "insertion 2") of the channel identified by the "eeID" into to the ON state.

Through the operations of steps S3, S4 or S5, current data of the effecter ON/OFF or insertion setting ON/OFF, corresponding to the object of processing "eID", in the current memory of the flash memory 11 is rewritten into the ON state, but also the display style of the effecter ON/OFF button 74 in the rectangular box, corresponding to the object of processing "eID", on the channel effecter setting screen of FIG. 8 is changed to the ON state as indicated by hatching.

At step S6, the CPU 10 designates "eID" as a next object of processing on the basis of the effecter group EGx. In this manner, all of the "eIDs" registered in the list are made objects of processing, one by one, in the registered order of the "eIDs" in the list. Thus, the operations of steps S2 to S7 are repeated until designation of all of the "eIDs" registered in the list have been completed, so that all of the effecters belonging to the effecter group (insertion setting of the default, inner and/or external effecters) are collectively set to the ON state. Once all of the effecters belonging to the effecter group are set to the ON state (NO determination at step S7), the CPU 10 goes to step S8 in order to illuminate the operated effecter group switch (any one of the switches 130 to 132).

With reference to FIG. 13, the following describe processing for setting a given effecter group EGx to the OFF state, i.e. OFF processing performed when any one of the effecter group switches 130-132 in the ON (i.e., illuminated) state has been operated. Operations performed for setting the given effecter group EGx to the OFF state are written in parentheses at the blocks of steps S3, S4, S5 and S8 in FIG. 13. In the OFF processing, the CPU 10 sequentially designates eIDs as objects of processing, one by one, sequentially from the top of the list of the group EGx at steps S1 and S6, and sets an effecter (insertion setting of an default effecter, internal effecter or external effecter), indicated by the eID of each of the objects of processing, to the OFF state at step S2, S3, S4 and S5. Namely, in the OFF processing, current data of the effecter ON/OFF or insertion setting ON/OFF in the current memory of the flash memory 11 is rewritten into the OFF state, but also the display style of the effecter ON/OFF button 74 in the rectangular box 71, corresponding to the object of processing "eID", on the channel effecter setting screen of FIG. 8 is changed into the OFF (white-out) state. By the operations S2 to S7 being repeated, all of the effecters belonging to the effecter group are collectively set into the OFF state. Once all of the effecters belonging to the effecter group are set into the OFF state (NO determination at step S7), the CPU 10 goes to step S8 in order to deilluminate the operated effecter group switch (any one of the switches 130 to 132).

Further, if the user keeps a desired one of the effecter group switches 130 to 132 depressed ("long depression of the key"), the rectangular boxes 71 corresponding to the plurality of effecters belonging to the depressed effecter group switch 130-132 are displayed in a style (e.g., hatched style) different from the others, so that the user can readily visually recognize the plurality of effecters belonging to the effecter group.

With a desired one of the effecter group switches 130 to 132 kept depressed long as noted above, the user can touch, on the channel effecter setting screen, the rectangular box 71 of an effecter that does not belong to the long-depressed desired effecter group switch 130-132, to instruct that the touched effecter be added to the desired effecter group.

Figure 14:
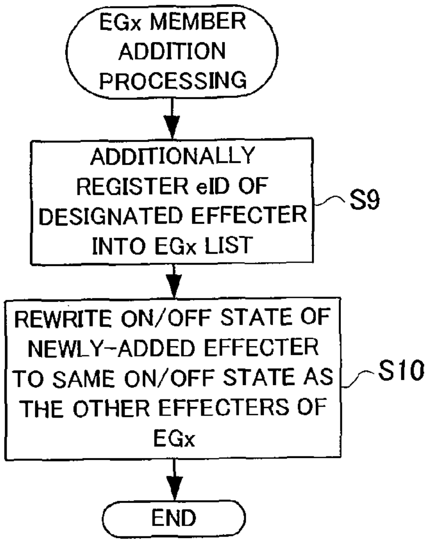
FIG. 14 is a flow chart showing an example operational sequence of processing for adding a new effecter to an effecter group.

FIG. 14 is a flow chart showing an example operational sequence of effecter group (EGx) member addition processing performed by the CPU 10 in response to a user's instruction (member addition instruction) for adding a new member effecter to a given effecter group EGx. At step S9, the CPU 10 registers the eID of the effecter, which has been instructed to be added as the new effecter member, into the group list 90 (FIG. 12) within the current memory.

At next step S10, the CPU 10 rewrites the current data of the ON/OFF or insertion setting ON/OFF parameter of the newly-added effecter to the same ON/OFF state of the other effecters of the group EGx. Thus, all of the effecters, including the current newly-added effecter, of the group EGx can be set into the same ON/OFF state. Namely, at step S10, the CPU 10 makes an ON/OFF state of the ON/OFF parameter for the newly-added effecter identical to the ON/OFF parameters for the other effecters that have been included in the effecter group EGx Further, with a desired one of the effecter group switches 130 to 132 kept depressed long as noted above, the user can touch, on the channel effecter setting screen, the rectangular box 71 of an effecter that belongs to the long-depressed desired effecter group switch 130-132, to instruct that the touched effecter be removed from the desired effecter group.

Figure 15:
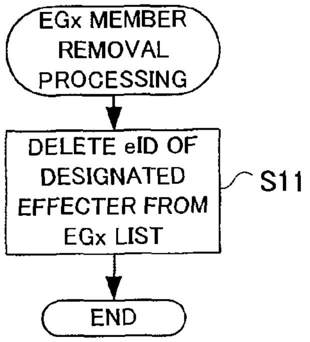
FIG. 15 is a flow chart showing an example operational sequence of processing for removing an effecter from an effecter group.

FIG. 15 is a flow chart showing an example operational sequence of effecter group (EGx) member removal processing performed by the CPU 10 in response to a user's instruction (member removal instruction) for removing a member effecter from a given effecter group EGx. At step S11, the CPU 10 deletes the member data corresponding to the eID of the effecter, which has been instructed to be removed, from the effecter group (EGx) list. In this way, the effecter can be removed from the given effecter group EGx.

According to the instant embodiment, as set forth above, effecter groups are each created with a plurality of effecters inserted in one or more desired insertion points of one or more desired channels, so that, in response to user's operation of any one of the effecter group switches 130 to 132, a plurality of effecters belonging to the group corresponding to the operated effecter group switch 130-132 can be turned on or off simultaneously. For example, when a sound effect, such as "radio voice", is to be created with a plurality of effecters inserted in desired insertion points of one or more desired channels, and if a plurality of effecters to be used for the sound effect are grouped into one group, the sound effect to be created by the plurality of effecters can be turned on or off as desired by the user merely operating any one of the effecter group switches 130 to 132 that corresponds to that group. Further, because the instant embodiment can create an effect group with any of internal, external and default effecters 29, 30, 34 and 35, it can collectively change the ON/OFF state of effecters across a plurality of channels in an interlocked fashion between the channels irrespective of which of the internal, external and default effecters 29, 30, 34 and 35 the effecter group is composed of.

Note that the parameters to be caused to operate in an interlocked fashion between a plurality of effecters belonging to an effecter group are not limited to effecter ON/Off parameters (e.g., ON/OFF of internal effecters and default effecters and insertion setting ON/OFF of external effecters) and may be other than such effecter ON/Off parameters. For example, the instant embodiment may be arranged to collectively adjust sound level parameters of a plurality of effecters belonging to an effecter group. For example, sound volume levels of a plurality of effecters belonging to an effecter group designated by any one of the effecter group switches 130 to 132 may be adjusted collectively. The collectively-adjusted sound level parameters are each a level of the effecter or a send level from an insertion point to the effecter (or send level in the case of insertion setting of an external effecter).

Further, whereas the instant embodiment has been described as constructed to collectively control parameters of an effecter group in response to operation of a corresponding one of the effecter group switches 130 to 132, such a construction is not necessarily essential, and the present invention may be constructed in any other suitable manner as long as it can group effecters across a plurality of channels and collectively control parameters of the effecter group. Further, whereas the instant embodiment has been described as constructed to create or set an effecter group in response to long depression of an effecter group switch, the present invention may be constructed to set an effecter group by use of any other suitable scheme. As one alternative scheme, a group setting screen having a list of effecters capable of being grouped and a section indicating member effecters of individual groups may be displayed on the touch panel 100 so that a desired effecter included in the list can be added to a desired group in response to operation on the group setting screen. As another alternative scheme, a list of effecters (effecter names) may be displayed on the touch panel 100 and a list (dropdown list for the user to select an effecter group for each of the effecters) may be presented, in response to user's selection of any one of the effecter names, so that an effecter group to which the effecter should belong to can be selected on the basis of the displayed list.

The present features can be arranged and implemented as a software program for execution by a processor such as a computer or DSP, as well as a storage medium storing such a software program.

This application is based on, and claims priority to, JP PA 2010-261819 filed on 24 Nov. 2010. The disclosure of the priority application, in its entirety, including the drawings, claims, and the specification thereof, are herein incorporated by reference.

What is claimed is:

1. A digital audio mixer comprising:

a signal processing section that has a plurality of channels each configured to process audio signals;

a plurality of effecters each configured to perform effect processing on an audio signal;

an effecter insertion section configured to, in response to an effecter insertion instruction given by a user, insert one or more effecters selected from among the plurality of effecters into one or more desired insertion points on signal paths of desired one or more of the plurality of channels;

an effecter group setting section configured to, in response to effecter group designation by the user, set up one effecter group including a plurality of effecters inserted into one or more channels designated by the user from among the plurality of channels; and an effecter group control section configured to, in response to an effecter group instruction given by the user, collectively control parameters for the one or more effecters belonging to the effecter group.

2. The digital audio mixer according to claim 1, wherein the plurality of effecters include:

internal effecters to be inserted by the effecter insertion section into a desired insertion point of a channel designated by the user from among the plurality of channels; and default effecters provided as standard in predetermined positions on the signal paths of the plurality of channels, wherein the effecter group setting section sets up one effecter group including the internal effecters and the default effecters, and wherein the effecter group control section collectively controls the parameters for the internal effecter and the default effecter belonging to the one effecter group.

3. The digital audio mixer according to claim 1, further comprising:

an input section configured to receive audio signals to be supplied to the plurality of channels for processing; and an output section configured to output signals processed through the plurality of channels, wherein the plurality of effecters include an external effecter externally connected to the digital audio mixer via the input section and the output section, wherein the effecter insertion section sets, in response to an effecter insertion instruction given by the user, insertion of the connected external effecter into a desired insertion point of a desired one of the channels, wherein the effecter group setting section sets up one effecter group including the designated effecters and the external effecter, and wherein the effecter group control section collectively controls the parameters for the designated effecters and the external effecter belonging to the one effecter group.

4. The digital audio mixer according to claim 1, wherein, when an instruction for adding a new effecter to the effecter group has been given by the user, the effecter group setting section further makes the parameter for the new effecter identical to the parameters for the effecters that have been included in the effecter group.

5. The digital audio mixer according to claim 1, wherein:

the effecter group control instruction is an effecter group ON/OFF instruction and the control parameters are ON/OFF parameters, the effecter group control section is configured to, in response to the effecter group ON/OFF instruction given by the user, collectively set, to either one of an ON state or an OFF state, the ON/OFF parameters for the one or more effecters belonging to the effecter group, and when the ON/OFF parameter for a given one of the effecters is ON, the effect processing of the given effecter is enabled while, when the ON/OFF parameter for the given effecter is OFF, the effect processing of the given effecter is disabled.

6. The digital audio mixer according to claim 1, further comprising:

an effect processing ON/OFF control section configured to store therein ON/OFF parameters for individual ones of the plurality of effecters, wherein, when the ON/OFF parameter for one of the effecters, inserted by the effecter insertion section, is ON, effect processing of the one effecter is enabled while, when the ON/OFF parameter for the one effecter is OFF, the effect processing of the one effecter is disabled, and wherein the parameters to be collectively controlled by the effecter group control section are the ON/OFF parameters, and the effect processing ON/OFF control section renews the stored ON/OFF parameters for individual ones of the plurality of effecters according to the collective control by the effecter group control section.

7. A method of operating a digital mixer comprising a plurality of channels each configured to process audio signals and a plurality of effecters each configured to perform effect processing to an audio signal, the method comprising:

an inserting step of, in response to an effecter insertion instruction given by a user, inserting one or more effecters selected from among the plurality of effecters into one or more desired insertion points on signal paths of desired one or more of the plurality of channels;

a setting step of, in response to effecter group designation by the user, setting up one effecter group including one or more effecters designated by the user from among effecters inserted into the plurality of channels; and a collective controlling step of, in response to an effecter group instruction given by the user, collectively controlling parameters for the one or more effecters belonging to the effecter group.

8. The method according to claim 7, wherein:

the effecter group control instruction is an effecter group ON/OFF instruction and the control parameters are ON/OFF parameters, and the collective controlling step, in response to the effecter group ON/OFF instruction given by the user, collectively sets, to either one of an ON state or an OFF state, the ON/OFF parameters for the one or more effecters belonging to the effecter group, when the ON/OFF parameter for a given one of the effecters is ON, the effect processing of the given effecter is enabled while, when the ON/OFF parameter for the given effecter is OFF, the effect processing of the given effecter is disabled.

9. The method according to claim 7, further comprising:

a storing step of storing ON/OFF parameters for individual ones of the plurality of effecters, wherein, when the ON/OFF parameter for one of the effecters, inserted by the inserting step, is ON, effect processing of the one effecter is enabled while, when the ON/OFF parameter for the one effecter is OFF, the effect processing of the one effecter is disabled, and wherein the parameters to be collectively controlled by the collectively controlling step are the ON/OFF parameters, and the storing step renews the stored ON/OFF parameters for individual ones of the plurality of effecters according to the collective control in the collectively controlling step.

* * * * *